US008928345B2

(12) United States Patent
Juenemann et al.

(10) Patent No.: US 8,928,345 B2
(45) Date of Patent: Jan. 6, 2015

(54) MEASURING COUPLER USING STRIP CONDUCTOR TECHNOLOGY

(75) Inventors: Ralf Juenemann, Munich (DE); Alexander Bayer, Munich (DE); Michael Freissl, Munich (DE); Christian Evers, Heimstetten (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 769 days.

(21) Appl. No.: 13/056,097

(22) PCT Filed: May 27, 2010

(86) PCT No.: PCT/EP2010/003230

§ 371 (c)(1), (2), (4) Date: Mar. 25, 2011

(87) PCT Pub. No.: WO2010/139420

PCT Pub. Date: Dec. 9, 2010

(65) Prior Publication Data

US 2011/0187401 A1 Aug. 4, 2011

(30) Foreign Application Priority Data

Jun. 4, 2009 (DE) ......................... 10 2009 023 872
Sep. 9, 2009 (DE) ......................... 10 2009 040 725
Oct. 30, 2009 (DE) ......................... 10 2009 051 370

(51) Int. Cl.
*G01R 31/00* (2006.01)
*H01P 5/18* (2006.01)

(52) U.S. Cl.
CPC ...................................... *H01P 5/184* (2013.01)
USPC ............ 324/756.05; 324/756.01; 324/756.02; 324/756.03; 324/756.04; 324/756.06

(58) Field of Classification Search
USPC ........................................ 324/756.01–756.07
See application file for complete search history.

(56) References Cited

U.S. PATENT DOCUMENTS 4,810,981 A * 3/1989 Herstein ......................... 333/27
4,983,933 A 1/1991 Volk et al.
5,055,807 A 10/1991 Oldfield
5,308,250 A * 5/1994 Walz ................................ 439/63

(Continued)

FOREIGN PATENT DOCUMENTS

DE 102006038029 A1 2/2008
EP 1089079 A2 4/2001
EP 2071341 A2 6/2009

OTHER PUBLICATIONS

International Search Report for PCT/EP2010/003230 dated Aug. 11, 2010.

(Continued)

*Primary Examiner* — Patrick Assouad
*Assistant Examiner* — Adam Clarke
(74) *Attorney, Agent, or Firm* — Marshall, Gerstein & Borun LLP

(57) ABSTRACT

A test coupler for supplying a device under test with test signals contains a first coaxial connector, a waveguide port, and a first strip conductor. Test signals of a lower frequency range are supplied to the first coaxial connector. Test signals of an upper frequency range are supplied to the waveguide port. The test coupler guides the test signals on the first strip conductor to the device under test.

32 Claims, 10 Drawing Sheets

(56) References Cited

U.S. PATENT DOCUMENTS

| | | | | |
|---|---|---|---|---|
| 5,408,188 | A * | 4/1995 | Katoh | 324/756.03 |
| 5,477,159 | A * | 12/1995 | Hamling | 324/755.02 |
| 7,002,433 | B2 * | 2/2006 | Antkowiak et al. | 333/116 |
| 7,159,187 | B2 | 1/2007 | Bernard et al. | |
| 7,348,786 | B2 * | 3/2008 | Thacker et al. | 324/755.07 |
| 7,453,276 | B2 * | 11/2008 | Hayden et al. | 324/754.03 |
| 7,627,445 | B2 * | 12/2009 | Ito | 702/117 |
| 7,759,953 | B2 * | 7/2010 | Strid et al. | 324/762.05 |
| 7,859,361 | B2 | 12/2010 | Evers et al. | |
| 2003/0117230 | A1 | 6/2003 | Shin | |
| 2003/0214365 | A1 | 11/2003 | Adar et al. | |
| 2006/0025947 | A1 | 2/2006 | Earls | |
| 2007/0024307 | A1 * | 2/2007 | Pukushima et al. | 324/763 |
| 2008/0094072 | A1 | 4/2008 | Noujeim | |
| 2010/0207702 | A1 * | 8/2010 | Perottino et al. | 333/125 |

OTHER PUBLICATIONS

Wohlgemuth et al., "Active Probes for Network Analysis within 70-230 GHz," *IEEE Transactions on Microwave Theory and Techniques*, 47, No. 12 (1999).

* cited by examiner

MEASURING COUPLER USING STRIP CONDUCTOR TECHNOLOGY

BACKGROUND OF THE INVENTION

1. Field of the invention

The invention relates to a test coupler for supplying a device under test with a test signal, especially within an ultra-broadband frequency range.

2. Related Technology

Electronic test equipment for microwave technology must generally be designed ultra-broadband in order to cover all possible customer applications. The lower frequency limit is then, for example, about 10 MHz with an upper frequency limit of about 60 GHz. The generation and processing of such a frequency range is split internally into several meaningful sub-ranges, which are, however, ultimately combined with one another at the front panel connector of a test equipment. A combination of this kind can be achieved in many different ways. In this context, the use of couplers has proved to be the best solution.

For example, U.S. Pat. No. 5,055,807 B1 discloses a switching between signals of different frequency ranges by means of a coupler and a switch. However, the disadvantage here is the unfavorable electrical properties of the switch, especially its high insertion loss. The high manufacturing costs and the poor long-term stability of a device of this kind are also disadvantageous.

A directional coupler using strip conductor technology, which is, however, not suitable as a test coupler for use with different sub-signals, is known from DE 10 2006 038 029 A1.

SUMMARY OF THE INVENTION

The invention provides a test coupler which supplies the signals of a lower and of an upper frequency range to a device under test.

A test coupler according to the invention for supplying a device under test with test signals contains a first coaxial connector, a waveguide port connection and a first strip conductor. Test signals of a lower frequency range are fed into the first coaxial connector. Test signals of an upper frequency range are fed into the waveguide port. The test coupler supplies the test signals on the first strip conductor to the device under test. Accordingly, the combination of a lower and an upper frequency range is guaranteed with low manufacturing cost.

The waveguide port is preferably connected to a waveguide. The waveguide is preferably connected to a waveguide-strip conductor transition. The waveguide-strip conductor transition is preferably connected to a second strip conductor. The waveguide-strip conductor transition converts test signals of the upper frequency range from waves preferably guided in the waveguide into waves guided on the second strip conductor. The conversion of a wave guided in the waveguide to a wave guided on the strip conductor is accordingly achieved with a low-cost.

The first coaxial connector is preferably connected to a first strip conductor-coaxial line transition. The first strip conductor is preferably connected to the first strip conductor-coaxial line transition. The first strip conductor-coaxial line transition preferably converts test signals of the lower frequency range from waves guided in a coaxial manner into waves guided on the first strip conductor. The conversion of a wave and guided in a coaxial manner into a wave guided on the strip conductor is accordingly achieved with a low-cost.

The first strip conductor and the second strip conductor advantageously form a forward coupler. The forward coupler advantageously supplies test signals of the lower frequency range or of the upper frequency range on the first strip conductor to the device under test. Accordingly, either a signal from the lower or from the upper frequency range can be supplied on the first strip conductor to the device under test.

The test coupler preferably further contains a second coaxial connector. By preference, the device under test is connected by means of the second coaxial connector. The second coaxial connector is preferably connected to a second strip conductor-coaxial line transition. By preference, the first strip conductor is connected to the second strip conductor-coaxial line transition. The second strip conductor-coaxial line transition preferably converts the test signals from waves guided on the strip conductor into waves guided in a coaxial manner and preferably guides them to the second coaxial connector. The conversion from waves guided on the strip conductor into waves guided in a coaxial manner is accordingly achieved with a low manufacturing cost.

The test coupler preferably further provides a third coaxial connector and a fourth coaxial connector. The third coaxial connector and the fourth coaxial connector are preferably connected by means of a third strip conductor. The third strip conductor and the second strip conductor preferably form a reverse coupler. The third coaxial connector preferably outputs signals, which are proportional to signals reflected from the device under test. The fourth coaxial connector preferably outputs reference signals, which are largely proportional to test signals of the lower frequency range. Accordingly, for the lower frequency range, a secure separation of the waves travelling into the device under test from the waves reflected by the device under test is achieved.

The third coaxial connector is preferably connected to a third strip conductor-coaxial line transition. The third strip conductor-coaxial line transition converts waves guided on the strip conductor into waves guided in a coaxial manner. The fourth coaxial connector is preferably connected to a strip conductor-coaxial line transition. The strip conductor-coaxial line transition converts waves guided on the strip conductor into waves guided in a coaxial manner. The third coaxial connector and the fourth coaxial connector are preferably connected by means of the third strip conductor-coaxial line transition, the fourth strip conductor-coaxial line transition and the third strip conductor. Accordingly, a low-reflection conversion of the differently guided waves is achieved with low manufacturing cost.

By preference, an attenuation element is inserted into the third strip conductor. This prevents reflections of the test structure surrounding the test coupler from being transformed to the directional coupler via a cable connected to the fourth coaxial connector and impairing its directivity.

The strip conductor-coaxial line transitions preferably provide compensations, which ensure a low-reflection conversion of the waves guided from the strip conductors into waves guided in a coaxial manner. Accordingly, a very low-reflection conversion is guaranteed.

The first strip conductor is preferably executed in two parts. The two parts of the first strip conductor are preferably meshed with one another at a connecting point. The separation into two parts in this context is implemented for manufacturing reasons. Accordingly, very low manufacturing cost can be achieved.

The second strip conductor is preferably connected to an absorber. A secure functioning of the forward coupler is guaranteed in this manner.

The strip conductors preferably provide a wave impedance of 50 Ohm. Accordingly, a simple integration into existing systems is possible.

The test coupler provides a housing, which is preferably composed of at least two housing parts. All of the strip conductors are preferably arranged in the housing. The housing acts as a shielding and/or counter-electrode for the strip conductors. Furthermore, a mechanical protection of the strip conductor components is achieved with low manufacturing cost.

Capacitive disturbances of the strip conductors caused by the fastening of the strip conductors in the housing are preferably largely eliminated by compensations. Accordingly, a secure positioning of the strip conductors with very low electromagnetic disturbances is achieved. This further reduces disturbances in transmission.

At least a part of the interior side of the housing is preferably lined with an absorber material. Accordingly, housing resonances are avoided and a further improvement of the electromagnetic properties of the test coupler is achieved.

The forward coupler and the reverse coupler are preferably designed using strip conductor technology. This avoids an interface between different waveguide types, which would impair the directivity of the reverse wave coupler.

BRIEF DESCRIPTION OF THE DRAWINGS

The invention is described below by way of example on the basis of the drawings, in which an advantageous exemplary embodiment of the invention is presented. The drawings show.

DETAILED DESCRIPTION

Initially, the general structure and functioning of the test coupler according to the invention will be explained with reference to FIGS. 1-3. The structure and functioning is further explained on the basis of several detail views with reference to FIGS. 4-12. Identical elements in similar drawings have not been repeated in some cases.

Figure 1:
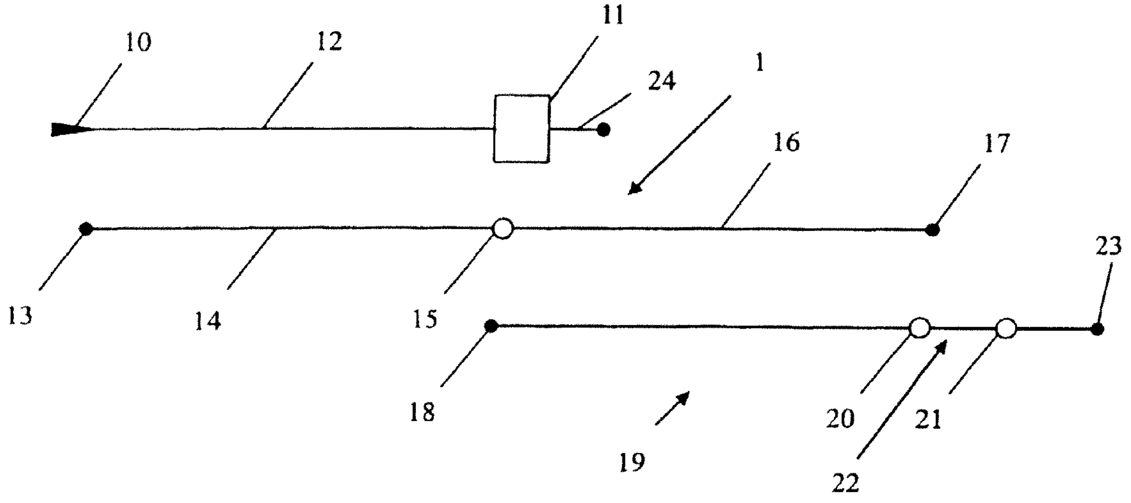
FIG. 1 shows a schematic presentation of the test coupler according to the invention.

FIG. 1 shows a schematic view of the test coupler according to the invention. A first strip conductor 1 is made up from the two parts 14, 16. These are connected to one another at a connecting point 15. At both ends, the first strip conductor 1 provides the coaxial connectors 13, 17. A second strip conductor 12 is disposed in spatial proximity to the first part 14 of the first strip conductor 1. This is connected at its first end to an absorber 10. At its second end, the second strip conductor 12 is connected to a waveguide-strip conductor transition 11, which is connected to a waveguide port 24.

A third strip conductor 19 is disposed in spatial proximity to the second part 16 of the first strip conductor 1. The third strip conductor 19 provides the coaxial connectors 18, 23 at both its ends. On the side of its second connector 23, the third strip conductor 19 is further interrupted. An attenuation element 22 is inserted at two connecting points 20, 21.

The first part 14 of the first strip conductor 1 and the second strip conductor 12 form a forward coupler. That is to say, a signal of the upper frequency range fed in via the waveguide port 24 and the waveguide-strip conductor transition 11 is transmitted with low attenuation to the coaxial connector 13 of the first part 14 of the first strip conductor 1. The signal is simultaneously transmitted, only with a very high attenuation, to the second part 16 of the first strip conductor 1. A waveguide not illustrated here is attached to the waveguide port 24. A signal of the upper frequency range is fed in via the waveguide port 24. A signal of the lower frequency range is fed in via the second coaxial connector 17 of the first strip conductor 1. Accordingly, either a signal of the lower frequency range or a signal of the upper frequency range is transmitted to the first coaxial connector 13 of the first strip conductor 1. A device under test is connected to this first coaxial connector 13 of the first strip conductor 1.

Through the forward coupler formed by the first part 14 of the first strip conductor 1 and the second strip conductor 12, either a signal of the lower frequency range fed in at the coaxial connector 17 or a signal of the upper frequency range fed in at the waveguide-strip transition 11 is supplied via the coaxial connector 13 to the device under test, which is not illustrated here. A part of the test signal passes through the device under test, not illustrated here, and is optionally measured at another port of the device under test. However, a part of the test signal is reflected by the device under test and once again enters the test coupler according to the invention at the coaxial connector 13 of the first part 14 of the first strip conductor 1.

The reflected signal is transmitted from the coaxial connector 13 to the first part 14 of the first strip conductor 1. Via the connecting point 15, it reaches the second part 16 of the first strip conductor 1. The second part 16 of the first strip conductor 1 and the third strip conductor 19 form a reverse coupler. That is to say, signals fed in at the connecting point 15 are transmitted with low attenuation to the coaxial connector 18 of the third strip conductor. At the same time, the connecting point 15 is isolated from the coaxial connector 23, so that signals are transmitted from the connecting point 15 to the coaxial connector 23 of the third strip conductor only with high attenuation. By the attenuation element 22, these signals are additionally attenuated. Furthermore, signals fed in at the coaxial connector 17 of the second part 16 of the first strip conductor 1 are coupled with low attenuation to the connector 23 of the third strip conductor. Although the attenuation element 22 attenuates these signals, a sufficiently high level remains at the connector 23. This signal is used as a reference signal for the measurement. The signals provided at the coaxial connector 18 of the third strip conductor 19, which are proportional to the signals reflected by the device under test, are used as the test signals.

Figure 2:
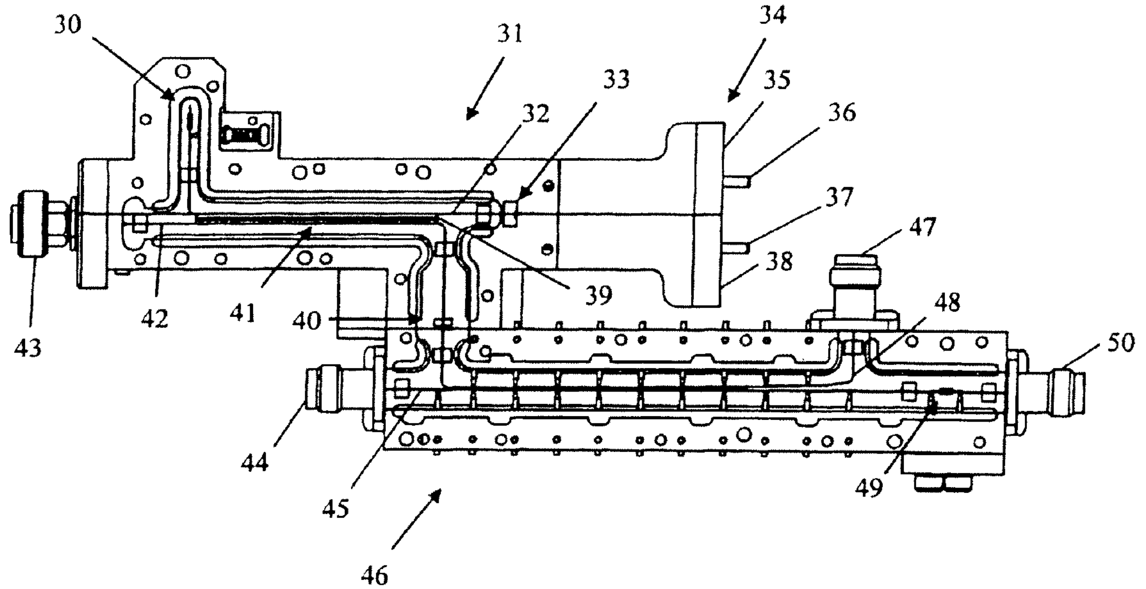
FIG. 2 shows an exemplary embodiment of the test coupler according to the invention in a lateral view with the lid opened.
Figure 3:
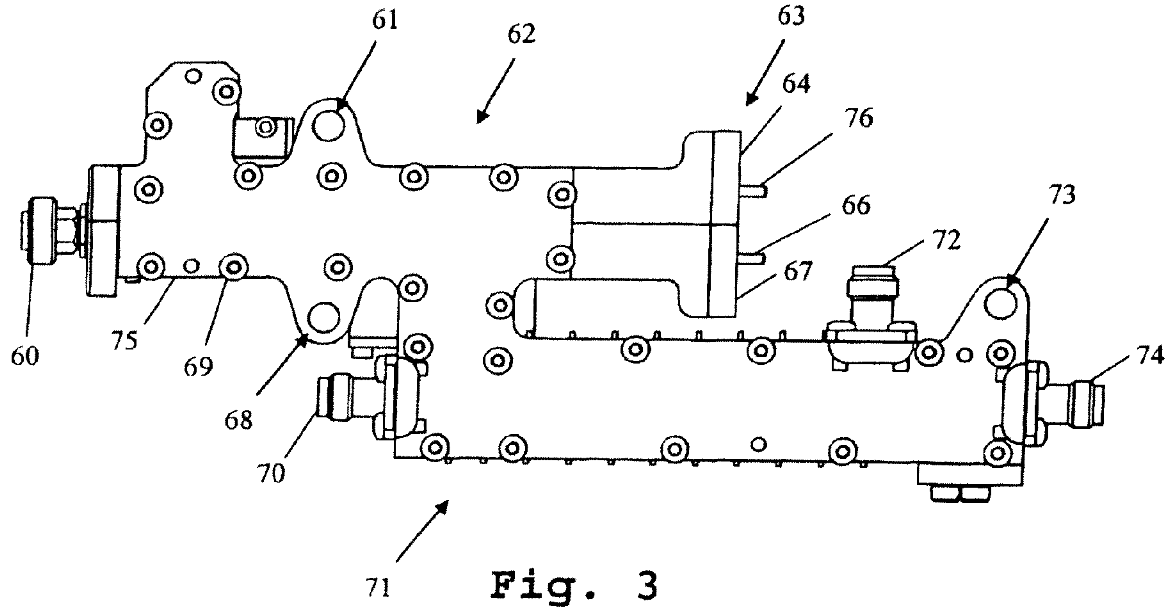
FIG. 3 shows the exemplary embodiment of the test coupler according to the invention in a lateral view with the lid closed.

In FIG. 2, a concrete exemplary embodiment of the test coupler according to the invention is shown. In this context, the substantial structure and the substantial function correspond largely to the structure and function shown in FIG. 1. A first strip conductor 41 comprises a first part 42 and a second part 48, which are connected at a connecting point 40. The first part 42 of the first strip conductor 41 provides a coaxial connector 43. The second part 48 of the first strip conductor 41 provides a coaxial connector 47. A second strip conductor 32 provides a waveguide-strip conductor transition 33 at its one end and an absorber 30 at its other end.

The second strip conductor 32 is disposed at least in part in spatial proximity to the first part 42 of the first strip conductor 41 and is coupled to the latter. In order to achieve a forward coupling, a dielectric 39 is disposed between the second strip conductor 32 and the first part 42 of the first strip conductor 41.

In this context, the first part 42 of the first strip conductor 41 and the second strip conductor 32 are disposed within a first housing 31. It is preferably made of a metal or another conducting material and is used as a shielding and/or counter-electrode and/or protection for the strip conductors.

The waveguide-strip conductor transition 33 allows the low-reflection transmission of a wave fed into the waveguide port 34 to the second strip conductor 32. The connecting waveguide between the waveguide port 34 and the waveguide-strip conductor transition is disposed within the two housing parts 35, 38, which, for their part, form the housing 31. The connecting waveguide is not visible in this illustration. The waveguide port 34 provides pins 36, 37, in order to guarantee an accurately fitting connection to the external waveguide, with the help of which a signal of the upper frequency range is fed into the test coupler.

The second part 48 of the first strip conductor 41 is disposed at least in portions in spatial proximity to a third strip conductor 45. The third strip conductor 45 provides a coaxial connector 44, 50 respectively at both ends. On the side of connector 50, the third strip conductor 45 is interrupted by an inserted attenuation element 49. In this context, the second part 48 of the first strip conductor 41 and the third strip conductor 45 are disposed within a second housing 46. The first housing 31 and the second housing 46 are connected together, for example, by means of screw connections. The two housings 31, 46 accordingly form a common housing.

With regard to the function of the test coupler illustrated here, reference is made to the remarks relating to FIG. 1.

FIG. 3 once again shows the exemplary embodiment of the test coupler according to the invention. The view illustrated here shows the test coupler with the housing closed. The first housing 62 is connected to the second housing 71. The first housing 62 provides a coaxial connector 60. The housing lid 75 is connected to the individual housings 62, 71 via screws 69 and provides fastening bore-holes 61, 68, 73. The housing lid 75 is used jointly in this context by the housings 62, 71. As already shown with reference to FIG. 2, the first housing 62 comprises two housing parts 64, 67, which each provides a register fitting pin 76, 66 at waveguide port 63. Eg. screws can be guided through the fastening bore-holes 61, 68, 73, by means of which the housing lid 75 can be attached to a surface. The second housing 71 provides three coaxial connectors 70, 72, 74.

Figure 4:
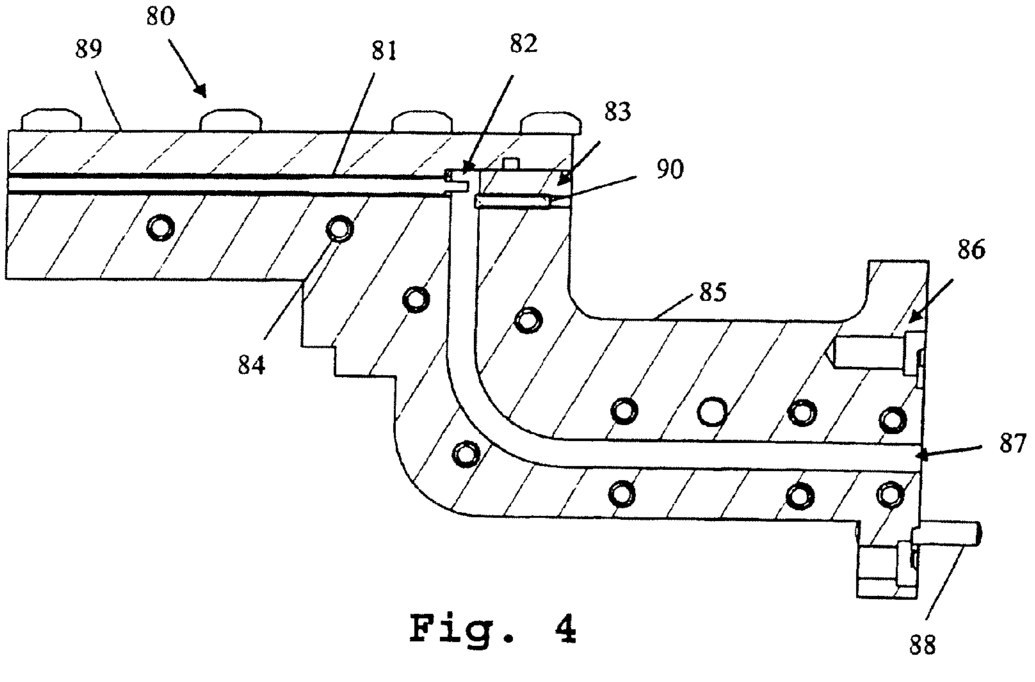
FIG. 4 shows the exemplary embodiment of the test coupler according to the invention in a first detailed view.

FIG. 4 shows the exemplary embodiment of the test coupler according to the invention in a detail view. The illustration shows a housing part 85, which corresponds to one of the housing parts 35, 38, 64, 67 from FIG. 2 respectively FIG. 3. Accordingly, the housing part 85 is connected by means of screws 84 to the second housing part, which is not illustrated here, and to the lid 89. Between the housing part 85 and the lid 89, a strip conductor 81 extends in an isolated manner. Together with the lid 89, the housing 85 accordingly forms the shielding and/or the counter-electrode for the strip conductor 81. The housing part 85 and the lid 89 are connected to one another via screws 80. One end of the strip conductor 81 projects into the end of a waveguide 87. The end of the strip conductor 81 and the end of the waveguide 87 accordingly form a waveguide-strip conductor transition 82. A signal fed into the waveguide 87 moves along the waveguide 87 and at its end meets the strip conductor 81. The end of the waveguide 87 accordingly preferably forms a □/4 short-circuit for the signals of the upper frequency range. The signal is coupled to the strip conductor 81 and is routed further by the latter.

For a low-reflection adjustment of the electromagnetic properties of the waveguide-strip conductor transition, the housing part 85 further provides a bore-hole 83 in the region of the waveguide-strip conductor transition 82 to receive a tuning screw 90. Accordingly, a capacitive compensation of the waveguide-strip conductor transition 82 is possible. This will be described in more greater detail with reference to FIG. 5. The housing part 85 further provides a register fitting pin 88 and a fastening bore-hole 86.

Figure 5:
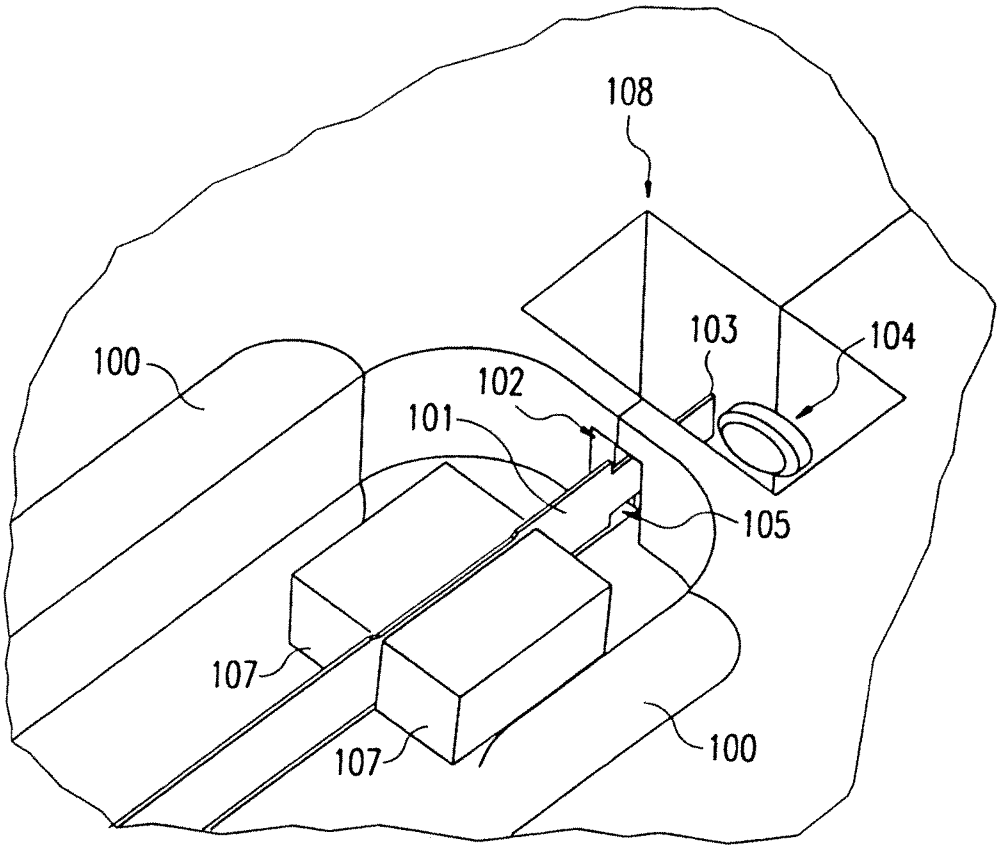
FIG. 5 shows the exemplary embodiment of the test coupler according to the invention in a second detailed view.

FIG. 5 shows the exemplary embodiment of the test coupler according to the invention in a further detail view. The region around the waveguide-strip conductor transition is illustrated here. A strip conductor 101 is held in position by fastening means 107. The end 103 of the strip conductor 101 is accordingly designed to be narrower than the strip conductor 101 and projects through a narrow aperture 102 into the waveguide 108. The width of the strip conductor 101 provides a step 105 in the direction towards the end 103. This step 105 has a capacitive effect but cannot compensate for the overall electromagnetically inductive behavior of the waveguide-strip conductor transition. Therefore, an additional capacitive compensation of the overall inductive electromagnetic behavior of the waveguide-strip conductor transition is achieved within the waveguide 108 with the tuning screw 104. In order to avoid housing resonances, the housing surrounding the strip conductor 101 is lined with an absorber material 100.

Figure 6:
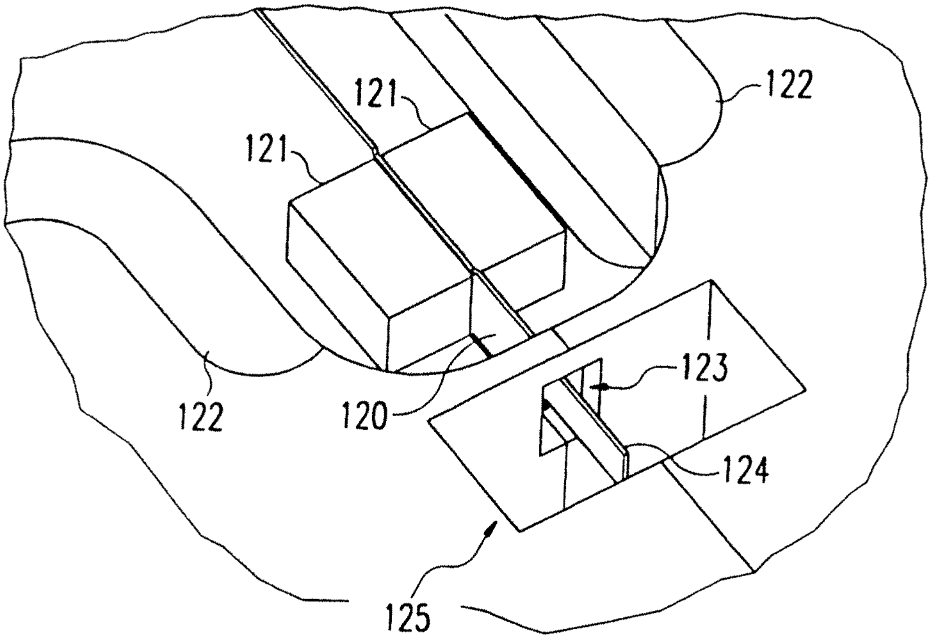
FIG. 6 shows the exemplary embodiment of the test coupler according to the invention in a third detailed view.

FIG. 6 shows the exemplary embodiment of the test coupler according to the invention in a further detail view. As in FIG. 5, the waveguide-strip conductor transition is also illustrated in detail here. A strip conductor 120 is held in position by fastening means 121. One end 124 of the strip conductor 120 projects through an aperture 123 into the waveguide 125. In order to avoid housing resonances, the housing surrounding the strip conductor 120 is lined with an absorber material 122.

Figure 7:
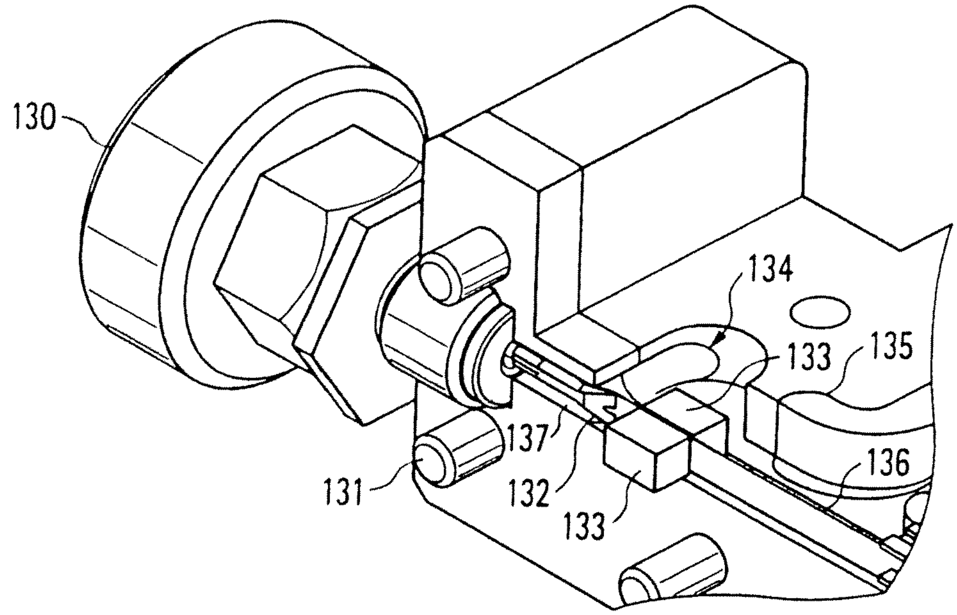
FIG. 7 shows the exemplary embodiment of the test coupler according to the invention in a fourth detailed view.

In FIG. 7, the exemplary embodiment of the test coupler according to the invention is shown in a further detail view. The region around the coaxial connector 130, to which the device under test is connected, is illustrated here. This corresponds with the connector 13 from FIG. 1. A strip conductor 136 is held in position by fastening means 133. The strip conductor 136 is connected to a strip conductor-coaxial line transition 137. The strip conductor-coaxial line transition 137 is connected to the coaxial connector 130.

In order to improve the transmission properties of the strip conductor-coaxial line transition 132, a compensation bore-hole 134 is provided on both sides. The compensation bore-hole 134 matches the field pattern of a wave guided on the strip conductor 136 to the field pattern of a wave guided in the coaxial connector 130. In order to avoid housing resonances, the housing surrounding the strip conductor 136 is further lined with an absorber material 135. The housing here consists of two housing parts, which are fixed to one another with fastening pins 131 and with screws, which are not illustrated here.

Figure 8:
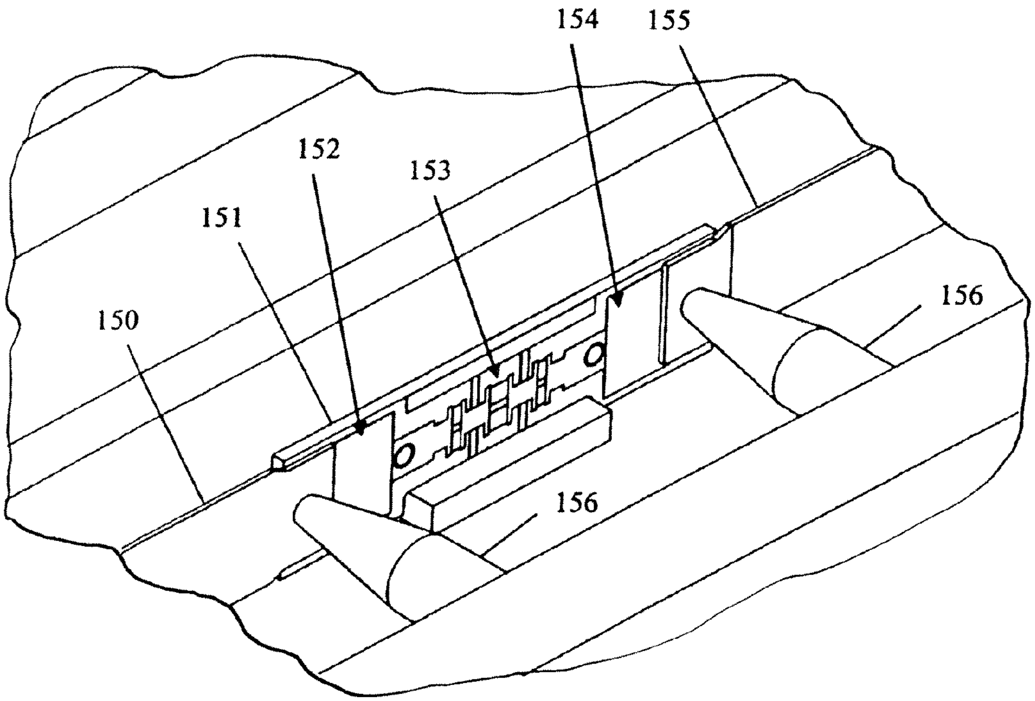
FIG. 8 shows the exemplary embodiment of the test coupler according to the invention in a fifth detailed view.

FIG. 8 shows the exemplary embodiment of the test coupler according to the invention in a further detail view. The attenuation element, which is inserted into the strip conductor at the reference connector, is illustrated here. The attenuation element corresponds to the attenuation element 22 from FIG. 1.

A first strip conductor element 150 and a second strip conductor element 155 are pressed by means of pins 156 onto two conductive contact surfaces 152, 154 at the ends of a substrate 151. The strip conductor elements 150, 155 accordingly form a common, interrupted strip conductor, which corresponds to the strip conductor 45 from FIG. 2. The conducting surfaces 152, 154 are connected to the attenuation element 153. The attenuation element 153 is realized by resistors applied to the surface of the substrate 151 using thin-layer technology. As an alternative, attenuation elements made from SMD resistors can be used. This represents a series and parallel circuit of several resistor elements. The pins 156 ensure a secure contact between the strip conductor elements 150, 155 and the contacts 152, 154 of the substrate 151. Particularly precisely determined electromagnetic properties are achieved by avoiding soldering.

Figure 9:
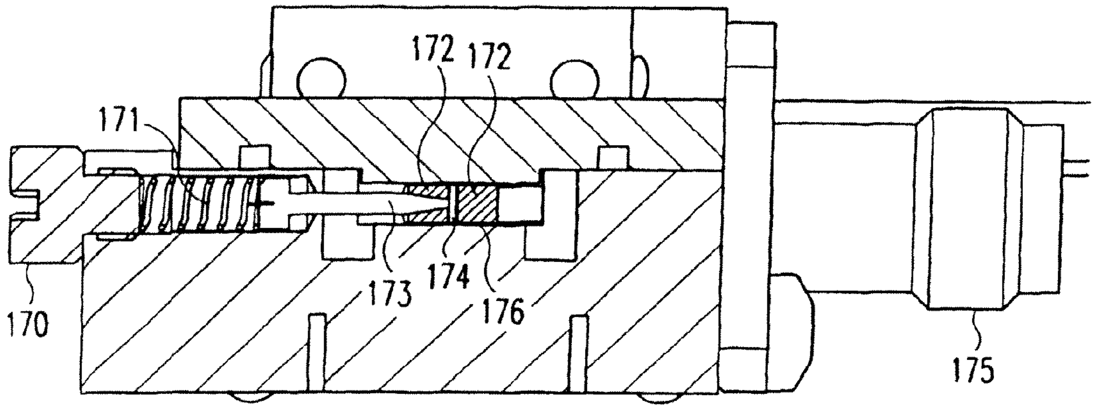
FIG. 9 shows the exemplary embodiment of the test coupler according to the invention in a sixth detailed view.

FIG. 9 shows the exemplary embodiment of the test coupler according to the invention in a further detail view. A sectional view of the surroundings of the attenuation element already illustrated in FIG. 8 is shown here. The strip conductor 174, interrupted by the attenuation element 176, which corresponds to the strip conductor elements 150, 155 from FIG. 8, is held in position by fastening elements 172. As illustrated here for one contact, the contact between the ends of the interrupted strip conductor 174 and the attenuation element 176, which corresponds to the substrate 151 from FIG. 8, is achieved by means of the pin 173. The spring 171 presses the strip conductor 174 onto the substrate 151 with the pin 173. The adjustment screw 170 is used for the adjustment of the spring tension. In this illustration, a coaxial connector 175, by means of which a signal of the lower frequency range is fed into the test coupler, is also visible.

Figure 10:
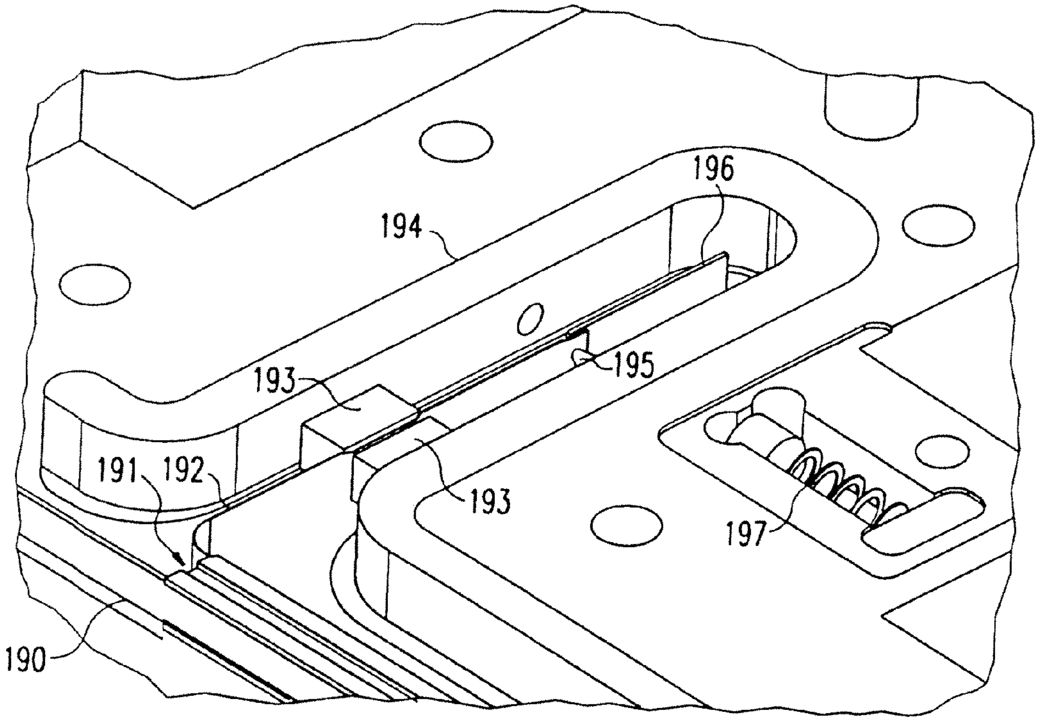
FIG. 10 shows the exemplary embodiment of the test coupler according to the invention in a seventh detailed view.

FIG. 10 shows the exemplary embodiment of the test coupler according to the invention in a further detail view. The region around the absorber, which has already been explained with reference to FIGS. 1-3, is shown here. A first strip conductor 190 and a second strip conductor 192 are guided by a dielectric 191. After leaving the dielectric 191, the second strip conductor 192 is bent 90°. It is held in this position by fastening elements 193. The end of the second strip conductor 192 is pressed onto the substrate 196 by a pin 195. In this context, the substrate 196 contains at least one attenuation element connected from the strip conductor to the ground of the housing with a nominal 50 Ohm wave impedance.

In order to improve the electromagnetic properties, two attenuation elements are preferably connected in parallel, one of which is disposed on the front side and the second on the rear side of the substrate 196. The ground connection is achieved in this context by contacting the surrounding housing. In order to avoid housing resonances, a part of the surrounding housing is lined with absorber material 194. As already described with reference to FIG. 9 in order to improve the contacting of the substrate 196 by the strip conductor 192, a spring 197 presses the strip conductor 192 with the pin 195 onto the substrate 196.

Figure 11:
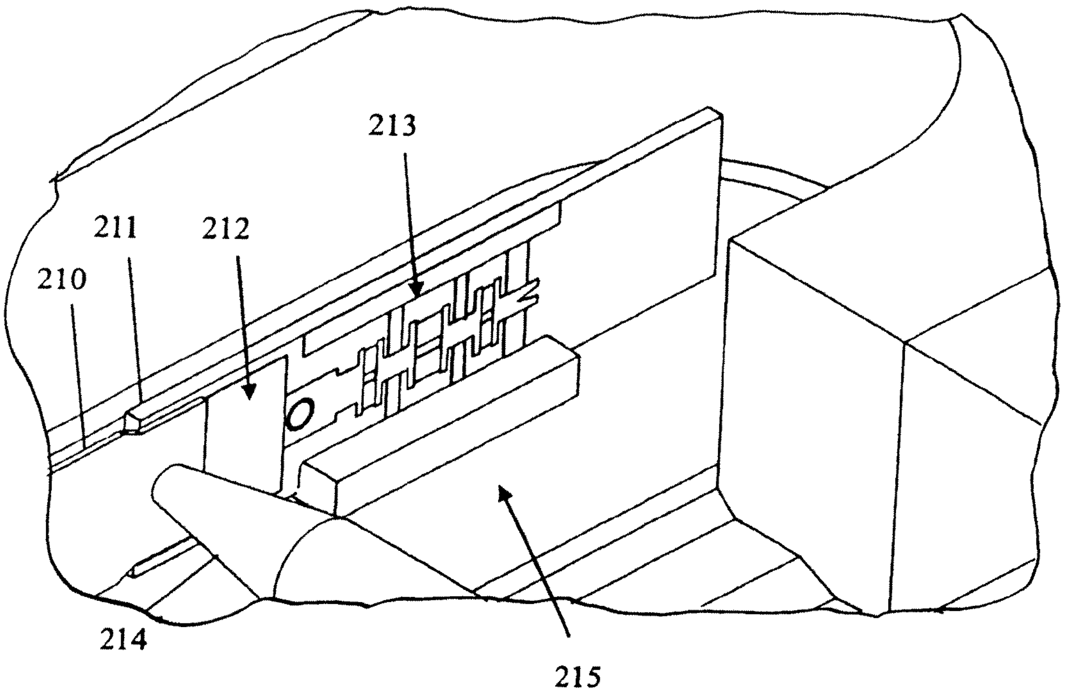
FIG. 11 shows the exemplary embodiment of the test coupler according to the invention in an eighth detailed view.

In FIG. 11, the exemplary embodiment of the test coupler according to the invention is shown in a further detail view. The region around the absorber is illustrated here also. Accordingly, the strip conductor 210 is pressed by the pin 214 onto a conducting surface 212 of the substrate 211. The conducting surface is connected to one or more serial and parallel resistor elements 213. The parallel resistor elements 213 in this context are connected to the ground of the housing at each end by means of conducting connecting elements 215. As an alternative, pure serial or pure parallel resistor elements can also be used.

Figure 12:
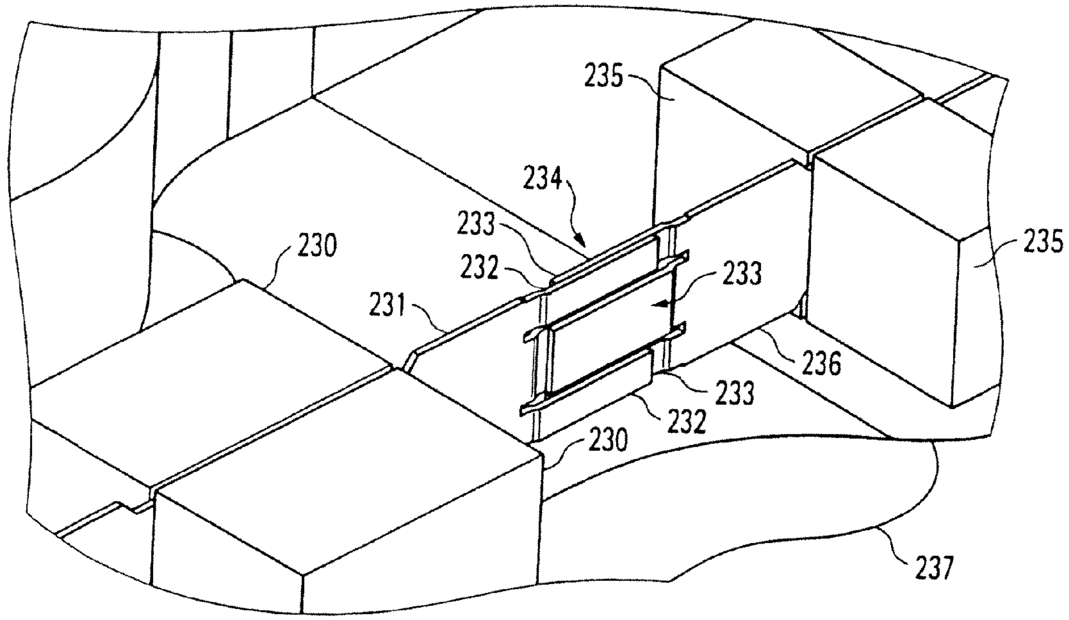
FIG. 12 shows the exemplary embodiment of the test coupler according to the invention in a ninth detailed view.

FIG. 12 shows the exemplary embodiment of the test coupler according to the invention in a further detail view. The connecting point 234 of the two parts of the first strip conductor 1 from FIG. 1 is illustrated here. A first part 236 is connected to a second part 231. The first part is held in position by means of the fastening elements 235. The second part 231 is held in position by means of the fastening elements 230.

At the connecting point 234, the ends of the strip conductors 231, 236 comprise several fingers 232, 233, which are meshed with one another. The finger structure 232, 233 provides a secure contacting of the two strip conductors 231, 236 by elastic forces. To avoid housing resonances, the housing which surrounds the connecting point 234 is lined with an absorber material 237.

The invention is not restricted to the exemplary embodiment presented. All of the features described above or illustrated in the drawings can be combined with one another as required within the framework of the invention. For example, other waveguide-strip conductor transitions can be used.

The invention claimed is:

1. A test coupler for supplying a device under test with test signals, comprising a first coaxial connector, a waveguide port, and a first strip conductor, wherein test signals of a lower frequency range are fed into the first coaxial connector, test signals of an upper frequency range are fed into the waveguide port, the test coupler supplies the test signals of the lower frequency range and the test signals of the upper frequency range on the first strip conductor to the device under test, the test coupler further comprises a second coaxial connector, the device under test is connected to the test coupler by the second coaxial connector, the second coaxial connector is connected to a second strip conductor-coaxial line transition, the first strip conductor is connected to the second strip conductor-coaxial line transition, and the second strip conductor-coaxial line transition converts test signals from waves guided on the strip conductor into waves guided in a coaxial manner and supplies them to the second coaxial connector.

2. The test coupler according to claim 1, wherein the waveguide port is connected to a waveguide, the waveguide is connected to a waveguide-strip conductor transition, the waveguide-strip conductor transition is connected to a second strip conductor, and the waveguide-strip conductor transition converts test signals of the upper frequency range from waves guided in the waveguide into waves guided on the second strip conductor.

3. The test coupler according to claim 2, wherein the second strip conductor is connected to an absorber.

4. The test coupler according to claim 2, wherein
the first strip conductor and the second strip conductor form a forward coupler, and
the forward coupler supplies test signals of the lower frequency range or of the upper frequency range on the first strip conductor to the device under test.

5. The test coupler according to claim 4, wherein the forward coupler is designed using strip conductor technology.

6. The test coupler according to claim 4, wherein the strip conductor-coaxial line transitions provide compensations, which ensure a low-reflection conversion of the waves guided by the strip conductors into waves guided in a coaxial manner.

7. The test coupler according to claim 1, wherein
the first coaxial connector is connected to a first strip conductor-coaxial line transition,
the first strip conductors connected to the first strip conductor-coaxial line transition, and
the first strip conductor-coaxial line transition converts test signals of the lower frequency range from waves guided in a coaxial manner into waves guided on the first strip conductor.

8. The test coupler according claim 7, wherein the strip conductor-coaxial line transitions provide compensations, which ensure a low-reflection conversion of the waves guided by the strip conductors into waves guided in a coaxial manner.

9. The test coupler according to claim 1, wherein
the first strip conductor is designed in two parts, and
the two parts of the first strip conductor are meshed with one another at a connecting point.

10. The test coupler according to claim 1, wherein
the test coupler provides at least one housing, wherein
the housing comprises at least two housing parts and all strip conductors are arranged in the housing.

11. The test coupler according to claim 10, wherein at least a part of the interior of the housing is lined with an absorber material.

12. The test coupler according to claim 10, wherein
at least a part of the strip conductors are attached in the housing by pins, and
the pins contact the strip conductors on broad sides of the strip conductors and hold the strip conductors in position.

13. The test coupler according to claim 12, wherein capacitive disturbances of the strip conductors caused by the attachment of the strip conductors in the housing are largely eliminated by compensations.

14. The test coupler according to claim 1, wherein the strip conductor-coaxial line transitions provide compensations, which ensure a low-reflection conversion of the waves guided by the strip conductors into waves guided in a coaxial manner.

15. A test coupler for supplying a device under test with test signals, comprising a first coaxial connector, a waveguide port, and a first strip conductor, wherein
test signals of a lower frequency range are fed into the first coaxial connector,
test signals of an upper frequency range are fed into the wavequide port, and
the test coupler supplies the test signals of the lower frequency range and the test signals of the upper frequency range on the first strip conductor to the device under test,
the test coupler further comprises a third coaxial connector and a fourth coaxial connector,
the third coaxial connector and the fourth coaxial connector are connected by a third strip conductor,
the third strip conductor and the second strip conductor form a reverse coupler,
the third coaxial connector outputs signals, which are largely proportional to signals reflected from the device under test, and
the fourth coaxial connector outputs reference signals, which are largely proportional to test signals of the lower frequency range.

16. The test coupler according to claim 15, wherein
the third coaxial connector is connected to a third strip conductor-coaxial transition,
the third strip conductor-coaxial line transition converts signals reflected from the device under test into waves guided in a coaxial manner,
the fourth coaxial connector is connected to a fourth strip conductor-coaxial line transition,
the fourth strip conductor-coaxial line transition converts the reference signals into waves guided in a coaxial manner, and
the third coaxial connector and the fourth coaxial connector are connected by the third strip conductor-coaxial line transition and the fourth strip conductor-coaxial line transition and the third strip conductor.

17. The test coupler according to claim 16, wherein the strip conductor-coaxial line transitions provide compensations, which ensure a low-reflection conversion of the waves guided by the strip conductors into waves guided in a coaxial manner.

18. The test coupler according to claim 15, wherein an attenuation element is inserted into the third strip conductor.

19. The test coupler according to claim 18, wherein the strip conductor-coaxial line transitions provide compensations, which ensure a low-reflection conversion of the waves guided by the strip conductors into waves guided in a coaxial manner.

20. The test coupler according to claim 15, wherein
the waveguide port is connected to a waveguide,
the waveguide is connected to a waveguide-strip conductor transition,
the waveguide-strip conductor transition is connected to a second strip conductor, and
the waveguide-strip conductor transition converts test signals of the upper frequency range from waves guided in the waveguide into waves guided on the second strip conductor.

21. The test coupler according to claim 20, wherein
the first strip conductor and the second strip conductor form a forward coupler, and
the forward coupler supplies test signals of the lower frequency range or of the upper frequency range on the first strip conductor to the device under test.

22. The test coupler according to claim 21, wherein the forward coupler is designed using strip conductor technology.

23. The test coupler according to claim 21, wherein the strip conductor-coaxial line transitions provide compensations, which ensure a low-reflection conversion of the waves guided by the strip conductors into waves guided in a coaxial manner.

24. The test coupler according to claim 20, wherein the second strip conductor is connected to an absorber.

25. The test coupler according to claim 15, wherein
the first coaxial connector is connected to a first strip conductor-coaxial line transition,
the first strip conductors connected to the first strip conductor-coaxial line transition, and
the first strip conductor-coaxial line transition converts test signals of the lower frequency range from waves guided in a coaxial manner into waves guided on the first strip conductor.

26. The test coupler according claim 25, wherein the strip conductor-coaxial line transitions provide compensations, which ensure a low-reflection conversion of the waves guided by the strip conductors into waves guided in a coaxial manner.

27. The test coupler according to claim 15, wherein
the first strip conductor is designed in two parts, and
the two parts of the first strip conductor are meshed with one another at a connecting point.

28. The test coupler according to claim 15, wherein
the test coupler provides at least one housing, wherein
the housing comprises at least two housing parts and all strip conductors are arranged in the housing.

29. The test coupler according to claim 28, wherein
at least a part of the strip conductors are attached in the housing by pins, and
the pins contact the strip conductors on broad sides of the strip conductors and hold the strip conductors in position.

30. The test coupler according to claim 29, wherein capacitive disturbances of the strip conductors caused by the attachment of the strip conductors in the housing are largely eliminated by compensations.

31. The test coupler according to claim 28, wherein at least a part of the interior of the housing is lined with an absorber material.

32. The test coupler according to claim 15, wherein the reverse coupler is designed using strip conductor technology.

* * * * *